(12) United States Patent
Schultz

(10) Patent No.: US 11,375,146 B2
(45) Date of Patent: Jun. 28, 2022

(54) WIDE-AREA SENSING OF AMPLITUDE MODULATED SIGNALS

(71) Applicant: Massachusetts Institute of Technology, Cambridge, MA (US)

(72) Inventor: Kenneth Schultz, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 170 days.

(21) Appl. No.: 16/801,276

(22) Filed: Feb. 26, 2020

(65) Prior Publication Data

US 2022/0166516 A1 May 26, 2022

Related U.S. Application Data

(60) Provisional application No. 62/810,505, filed on Feb. 26, 2019.

(51) Int. Cl.
| | |
|---|---|
| *H04B 10/114* | (2013.01) |
| *H04N 5/3745* | (2011.01) |
| *H03D 3/00* | (2006.01) |
| *H04N 5/355* | (2011.01) |
| *H04B 10/61* | (2013.01) |
| *G01S 7/487* | (2006.01) |
| *H04B 10/116* | (2013.01) |

(52) U.S. Cl.
CPC ......... *H04N 5/37455* (2013.01); *H03D 3/007* (2013.01); *H04B 10/1141* (2013.01); *H04B 10/613* (2013.01); *H04N 5/35554* (2013.01); *G01S 7/487* (2013.01); *H04B 10/116* (2013.01)

(58) Field of Classification Search
None
See application file for complete search history.

(56) References Cited

U.S. PATENT DOCUMENTS 5,213,105 A    5/1993  Gratton et al.
5,822,102 A *  10/1998 Bodeep ............. H04B 10/2589
                                                398/72

(Continued)

OTHER PUBLICATIONS

International Search Report and Written Opinion in International Patent Application No. PCT/US2020/019783 dated May 20, 2020, 24 pages.

*Primary Examiner* — Jai M Lee
(74) *Attorney, Agent, or Firm* — Smith Baluch LLP

(57) ABSTRACT

Amplitude-modulated (AM) signals spanning a spatial wide area can be efficiently detected using a slowly scanning optical system. The system decouples the AM carrier from the AM signal bandwidth (or carrier uncertainty), enabling Nyquist sampling of only the information-bearing AM signal (or the known frequency bandwidth). The system includes a staring sensor with N pixels (e.g., $N>10^6$) that searches for a sinusoidal frequency of unknown phase and frequency, perhaps constrained to a particular band by a priori information about the signal. Counters in the sensor pixels mix the detected signals with local oscillators to down-convert the signal of interest, e.g., to a baseband frequency. The counters store the down-converted signal for read out at a rate lower than the Nyquist rate of AM signal. The counts can be shifted among pixels synchronously with the optical line-of-sight for scanning operation.

17 Claims, 8 Drawing Sheets

(56) References Cited

U.S. PATENT DOCUMENTS

| | | | | |
|---|---|---|---|---|
| 5,838,441 | A * | 11/1998 | Satorius | G01S 3/782 356/491 |
| 8,179,296 | B2 | 5/2012 | Kelly et al. | |
| 8,605,853 | B2 | 12/2013 | Schultz et al. | |
| 8,692,176 | B2 | 4/2014 | Kelly et al. | |
| 8,933,832 | B2 | 1/2015 | Kelly et al. | |
| 9,159,446 | B2 | 10/2015 | Schultz et al. | |
| 9,270,895 | B2 | 2/2016 | Kelly et al. | |
| 9,385,738 | B2 | 7/2016 | Kelly et al. | |
| 9,491,389 | B2 * | 11/2016 | Kelly | G11B 20/0021 |
| 9,615,038 | B2 | 4/2017 | Kelly et al. | |
| 9,712,771 | B2 | 7/2017 | Kelly et al. | |
| 9,743,024 | B2 | 8/2017 | Tyrrell et al. | |
| 9,768,785 | B2 | 9/2017 | Schultz et al. | |
| 9,866,770 | B2 | 1/2018 | Colonero et al. | |
| 10,079,984 | B2 | 9/2018 | Kelly et al. | |
| 10,142,567 | B2 | 11/2018 | Colonero et al. | |
| 10,250,831 | B2 | 4/2019 | Tyrrell et al. | |
| 10,348,993 | B2 | 7/2019 | Kelly et al. | |
| 10,362,254 | B2 | 7/2019 | Kelly et al. | |
| 10,425,598 | B2 * | 9/2019 | Lin | G02F 1/133528 |
| 10,491,839 | B2 | 11/2019 | Colonero et al. | |
| 10,581,521 | B2 | 3/2020 | Shaw et al. | |
| 10,616,520 | B2 | 4/2020 | Tyrrell et al. | |
| 10,638,064 | B2 | 4/2020 | Colonero et al. | |
| 10,694,122 | B2 * | 6/2020 | Kelly | H04N 5/37455 |
| 10,771,722 | B2 | 9/2020 | Grossmann et al. | |
| 10,893,226 | B2 | 1/2021 | Kelly et al. | |
| 10,909,670 | B2 | 2/2021 | Milstein et al. | |
| 10,931,372 | B2 | 2/2021 | Shaw et al. | |
| 11,050,963 | B2 | 6/2021 | Tyrrell et al. | |
| 2008/0110261 | A1 | 5/2008 | Randall et al. | |
| 2012/0140809 | A1 | 6/2012 | Krause et al. | |
| 2012/0288286 | A1 | 11/2012 | Houtsma et al. | |
| 2015/0381183 | A1 | 12/2015 | Schultz et al. | |
| 2016/0191163 | A1 | 6/2016 | Preston et al. | |
| 2017/0280113 | A1 | 9/2017 | Shatz et al. | |
| 2020/0351459 | A1 | 11/2020 | Kelly et al. | |

* cited by examiner $f_c + f_b/2 \leq$ Frame Rate (for I&Q sampling and single-sideband modulation; Nyquist = Frame Rate)
$f_c + f_b/2 \leq$ Frame Rate/2 (for double-sideband modulation; Nyquist = Frame Rate/2)

WIDE-AREA SENSING OF AMPLITUDE
MODULATED SIGNALS

CROSS-REFERENCE TO RELATED APPLICATION(S)

This application claims the priority benefit, under 35 U.S.C. 119(e), of U.S. Application No. 62/810,505, which was filed Feb. 26, 2019, and is incorporated herein by reference.

GOVERNMENT SUPPORT

This invention was made with Government support under Grant No. FA8702-15-D-0001 awarded by the U.S. Air Force. The Government has certain rights in the invention.

BACKGROUND

A digital focal plane array (DFPA) is a focal plane array with one photodetector, one current-to-frequency converter, and at least one counter per pixel. The current-to-frequency converter converts photocurrent from the corresponding photodetector into a pulse train that is counted by the counter(s) in the same pixel as the photodetector and current-to-frequency converter. Each counter in each pixel can be controlled independently to filter the pulse train by counting up or down and/or by transferring data as desired. For example, a pixel may perform in-phase/quadrature filtering of homodyne- or heterodyne-detected photocurrent with two counters: a first counter toggled between increment and decrement modes with an in-phase signal and a second counter toggled between increment and decrement modes with a quadrature signal.

Transfer circuitry links the pixels together so that the pixels can exchange data (counts stored in the counters), e.g., for on-chip filtering or time-delay-and-integrate (TDI) imaging. For more information on DFPAs, see, e.g., U.S. Pat. Nos. 8,179,296, 8,692,176, 8,605,853, 9,615,038, or U.S. Pat. No. 9,866,770, which are incorporated herein by reference in their entireties.

SUMMARY

A DFPA can be used to efficiently detect spatially distributed amplitude-modulated (AM) signals whose carrier frequencies are higher than the DFPA frame rate as part of a slowly scanning optical system. It can also be used to detect a simple sinusoidal signal with unknown phase and unknown but bounded frequency (i.e., contained within a known frequency band). In either case, the DFPA decouples the AM carrier from the AM signal bandwidth (or frequency band) enabling Nyquist sampling of the information-bearing AM signal only (or Nyquist sampling of the known frequency bandwidth) at a rate lower than the AM carrier frequency. The technique is predicated on U.S. Pat. No. 8,605,853 B2 to Schultz et al., which is incorporated herein by reference in its entirety.

A pixel in a DFPA can be used to detect an amplitude-modulated (AM) optical signal having a center frequency $f_c$ and a bandwidth $f_b$ as follows. A photodetector in the pixel transduces the AM optical signal to an AM analog signal. A current-to-frequency converter in the pixel and operably coupled to the photodetector converts the AM analog signal into an electronic pulse train. Circuitry mixes a first copy of the electronic pulse train with an in-phase square wave modulated at a mixing frequency $f_{LO}$ to produce an in-phase representation of the AM optical signal, which is counted by a first counter in the pixel over at least part of an integration period less than or equal to $\frac{1}{2}f_b$. The circuitry mixes a second copy of the electronic pulse train with a quadrature square wave modulated at the mixing frequency $f_{LO}$ to produce a quadrature representation of the AM optical signal. A second counter in the pixel integrates (counts) the quadrature representation in the pixel over at least part of the integration period. The circuitry reads the in-phase representation and the quadrature representation from the pixel at a frame rate greater than or equal to $2f_b$.

The center frequency $f_c$ can be about 100 kHz to about 10 GHz and the bandwidth $f_b$ can be about 10 kHz to about 100 kHz.

The circuitry can mix the first copy of the electronic pulse train with the in-phase square wave by switching the first counter between a count-up mode and a count-down mode at the mixing frequency $f_{LO}$.

The in-phase and quadrature representations can be Fourier-transformed to produce a spectral signature of the AM optical signal.

The in-phase representation in the (first) pixel during a first portion of the integration period, then transferred from to a second pixel in the imaging array, where it is integrated in a counter during a second portion of the integration period. The first portion of the integration period can be an integer multiple of the reciprocal of the mixing frequency $f_{LO}$. Transferring the in-phase representation from the first pixel to the second pixel can occur synchronously with motion of the imaging array with respect to a source of the AM optical signal (e.g., a beacon). The in-phase representation may be de-modulated, if desired.

The DFPA can have many pixels perform this process simultaneously and independently. For example, if the pixel is a first pixel in the DFPA, a photodetector in a second pixel in the DFPA may transduce another AM optical signal having a center frequency $f_{c2}$ and a bandwidth $f_{b2}$ to another AM analog signal. A current-to-frequency converter in the second pixel converts the other AM analog signal to another electronic pulse train. Circuitry mixes a first copy of the other electronic pulse train with the in-phase square wave modulated to produce an in-phase representation of the other AM optical signal and mixes a second copy of the other electronic pulse train with the quadrature square wave to produce a quadrature representation of the other AM optical signal. First and second counters in the second pixel integrate the in-phase and quadrature representations, respectively, of the other AM optical signal over at least part of an integration period less than or equal to $\frac{1}{2}f_{b2}$. The in-phase and quadrature representations of the other AM optical signal can be read from the second pixel at a frame rate greater than or equal to $2f_{b2}$.

Another method of wide-area sensing with a DFPA or imaging array can be implemented as follows. At a pixel in the DFPA, an optical signal modulated with amplitude modulation having a center frequency $f_c$ and a bandwidth $f_b$ is detected. This amplitude modulation is mixed with a local oscillator signal at a mixing frequency $f_{LO}$ less than the center frequency $f_c$ to produce an intermediate-frequency (IF) representation of the amplitude modulation. The IF representation of the amplitude modulation is integrated as a count in a counter in the pixel. And the count is read at a frame rate less than a Nyquist rate of the amplitude modulation. In some case, the count is transferred from the counter in the pixel to a counter in another pixel in the imaging array synchronously with motion of the imaging array relative to a source of the optical signal.

Concurrently, at another pixel in the imaging array, another optical signal modulated with other amplitude modulation is detected. This other amplitude modulation is mixed with the local oscillator signal to produce an IF representation of the other amplitude modulation. This IF representation of the other amplitude modulation is integrated in a counter in the other pixel, then read out at a frame rate less than a Nyquist rate of the other amplitude modulation.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTION OF DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

A digital focal plane array can detect one or more amplitude-modulated (AM) signals while monitoring a signal. It can also down-convert the AM signals to lower carrier frequencies for slower readout without information loss. This makes it possible to detect and de-modulate AM optical signals modulated with radio-frequency (RF) signals whose carrier frequencies exceed the DFPA frame rate.

To understand how a DFPA senses an AM signal using this technique, consider a DFPA that detects an optical beacon that is modulated with an AM signal at a (potentially unknown) frequency between 500 Hz and 625 Hz. The Nyquist sampling rate for this AM signal is at 1250 Hz (double the highest signal frequency). This may be higher than the pixel read out rate of the DFPA.

A telescope focuses an image of the beacon onto a pixel in the DFPA. A photodetector in the DFPA pixel generates a photocurrent whose amplitude varies with the AM signal. A current-to-frequency converter in the DFPA pixel turns the photocurrent into a pulse train that represents the AM signal. Up/down counters in the DFPA pixel count the pulse train while being switched between up- and down-counting modes with 500 Hz in-phase and quadrature square waves. This down-converts the signal of interest to a baseband frequency between 0 Hz and 125 Hz.

The counters store the full array of in-phase and quadrature samples for read out at a Nyquist rate of 250 Hz (i.e., a DFPA frame rate of 250 frames per second), which is significantly lower than the Nyquist rate of the raw AM signal. The in-phase and quadrature samples can be read out simultaneously by configuring the in-phase and quadrature counters as a single shift register for read out. The Fourier transform of the in-phase and quadrature time series (with time duration given by the desired frequency resolution and/or signal-to-noise ratio) yields the (down-converted) spectral signature of the AM signal. In this way, the signal is obtained using a frame rate equal to 250 Hz, rather than the full Nyquist sampling frequency of 1250 Hz. In this example, the factor of five reduction in sampling rate is achieved by exploiting a priori signal information with on-chip DFPA in-phase and quadrature demodulation.

A Wide Field-of-View Camera for Detecting Amplitude-Modulated (AM) Signals

Figure 1:
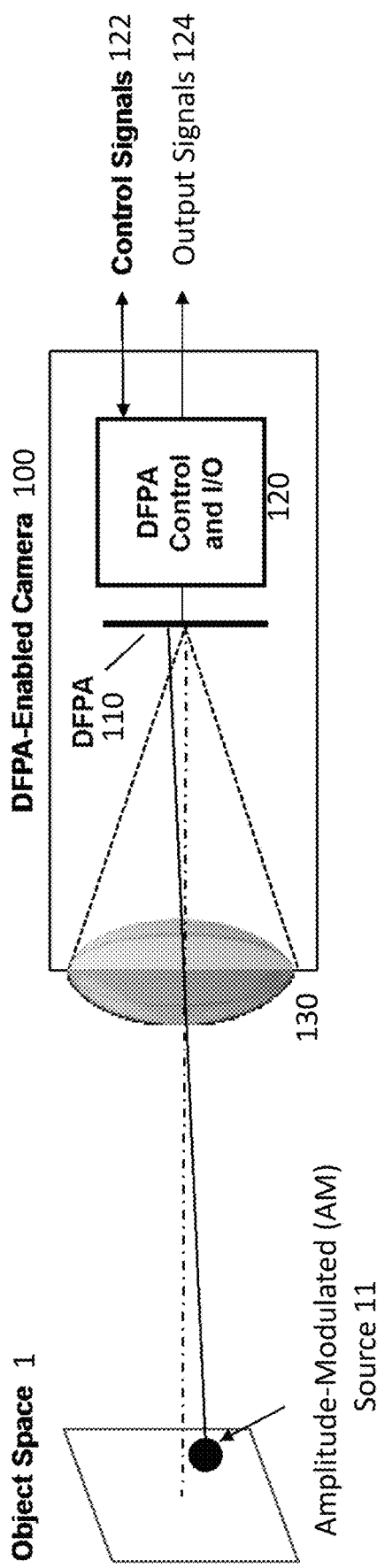
FIG. 1 shows a single camera employing a digital-pixel focal plane array (DFPA) sensor for wide-area sensing of AM signals.

FIG. 1 shows a wide field-of-view camera 100 directed toward a region 1 containing one or more amplitude-modulated (AM) signal sources 11. The camera 100 includes optics 130 that focus light onto a digital focal plane array (DFPA) 110, also known as a digital-pixel focal plane array. The DFPA 110 is coupled to control and input/output (I/O) circuitry 120, which may be implemented in a field-programmable gate array, application-specific integrated circuit, or other processor.

In operation, the DFPA 110 converts an AM optical signal, which may have a bandwidth from 2-100 kHz on a carrier frequency from 100 kHz to 1 GHz or more, from the AM source 11 into an AM digital signal (e.g., an electronic or digital pulse train). It down-converts and integrates the AM optical signal from the carrier frequency to a lower intermediate frequency according to one or more control signals 122 as explained in greater detail below. The control and I/O circuitry 120 reads out the integrated AM digital signal at a frame rate that is equal to or greater than the Nyquist frequency for the down-converted AM optical signal and lower than the carrier frequency of AM optical signal to provide video signals 124.

Figure 2A:
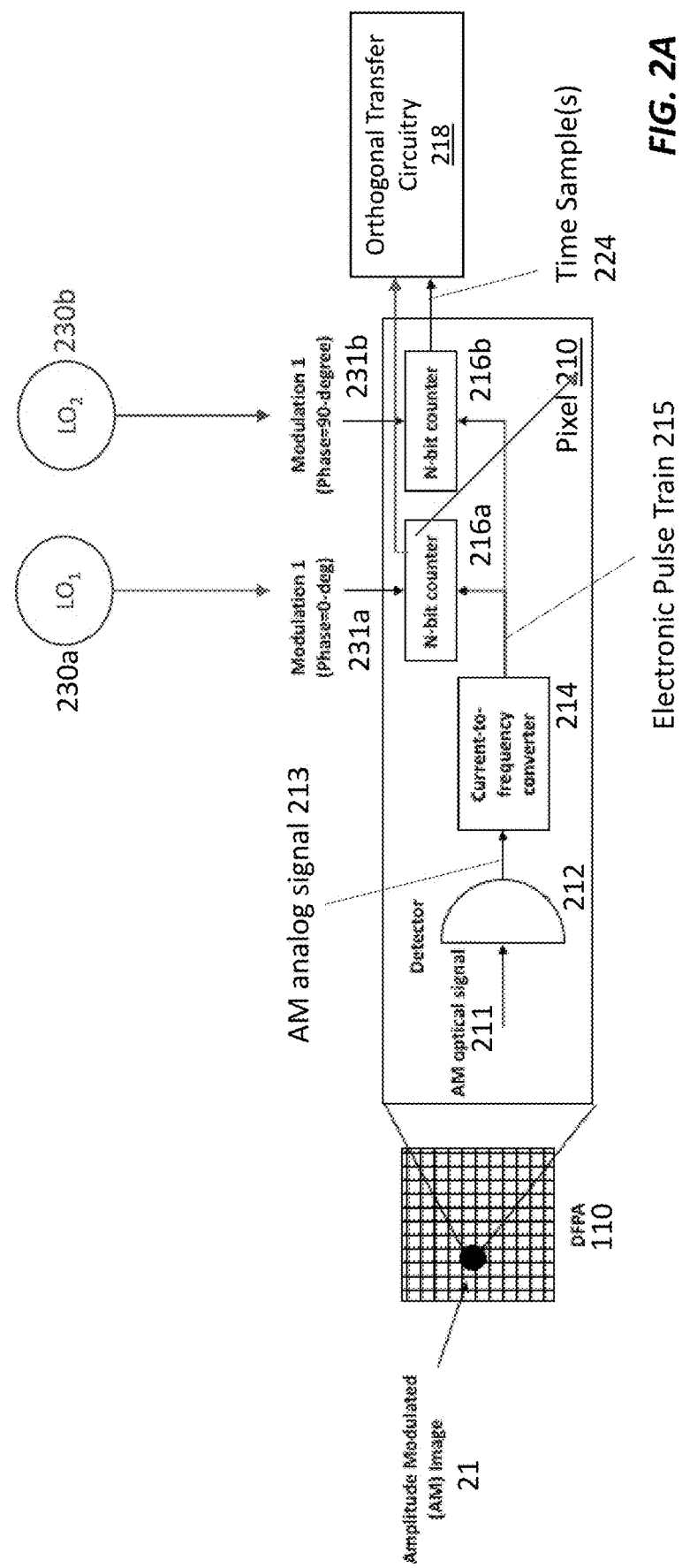
FIG. 2A shows a pixel in the DFPA sensor of FIG. 1.

FIG. 2A shows as simplified view of a pixel 210 in the DFPA 110. In this DFPA 110, the pixels 210 are laid out in a two-dimensional, rectilinear array, but other pixel arrangements are also possible. Each pixel 210 includes a photodetector 212, such as a Geiger-mode avalanche photodiode, that is coupled to a current-to-frequency converter 214. The current-to-frequency converter 214 is coupled in turn to one or more counters. These counters can be implemented as discrete N-bit up/down counters 216a and 216b as in FIG. 2A, or as a single (2N-bit) up/down counter that can be operated as several smaller independent counters.

The first up/down counter 216a is coupled directly to a first local oscillator (LO$_1$) 230a, and the second up/down counter 216b is coupled to a second local oscillator (LO$_2$) 230b, which, in this example, is at the same frequency as LO$_1$ 230a but 90 degrees out-of-phase (collectively, LOs 230). These LOs may serve the entire DFPA 110, with the first and second LO signals globally distributed to each pixel 210 in the DFPA 110. (That is, there can be a total of two LOs 230 for the entire DFPA 110.) If desired, each pixel 210 may include additional in-pixel circuitry (e.g., a mixer programmable with in-pixel memory) that can tune the frequencies of these global LO signals on a per-pixel basis.

And each pixel 210 in the DFPA 110 is coupled to its neighboring pixels 210 with orthogonal transfer circuitry 218, allowing the digital numbers to be exchanged and manipulated, e.g., for data processing. The orthogonal transfer circuitry 218 is connected to all of the bits in the counters 216 with independent control of the counters 216 and to each of the neighboring pixels 210 in the DFPA. (The bits act as a counter in signal accumulation mode but are configured as a shift register in data transfer mode.) In operation, the orthogonal transfer circuitry 218 can transfer one or more of the bits to one or more of the neighboring pixels. For more on DFPAs and DFPA operation, including a more detail on the orthogonal transfer circuitry 218, please see, e.g., U.S. Pat. No. 8,605,853 B2 to Schultz et al., which is incorporated herein by reference in its entirety.

Figure 2B:
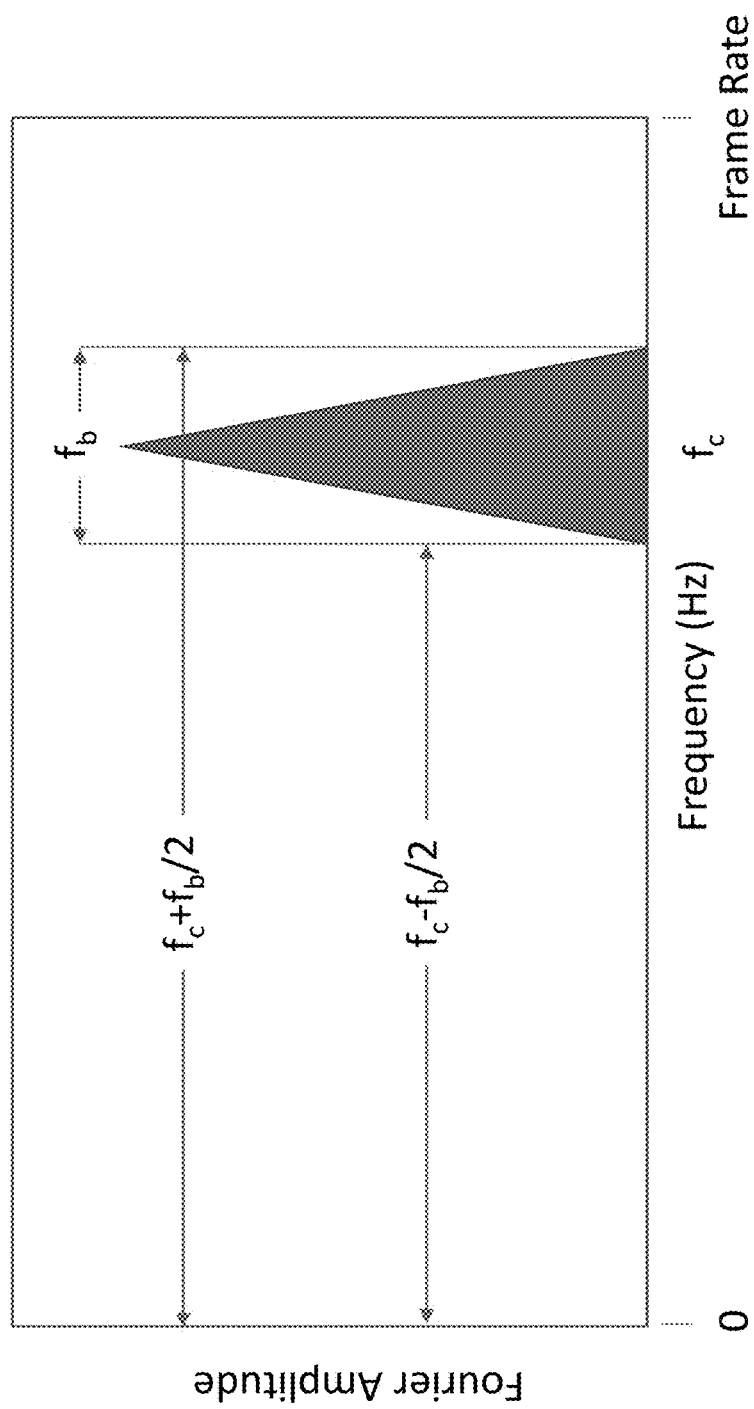
FIG. 2B illustrates the spectrum and Nyquist sampling rates of the AM signal detected by the pixel of FIG. 2A.

FIGS. 2A and 2B illustrate the detection and frequency-shifting operation performed in each pixel 210 of the DFPA 110. The DFPA 110 detects an AM image 21 of the AM source 11 (FIG. 1) at one or more pixels 210. In some cases, different pixels 210 in the DFPA 110 may detect AM images of many different AM sources simultaneously; because each pixel 210 operates independently, the DFPA 110 can detect all of these AM sources simultaneously, possibly while detecting static imagery as well.

The photodetector 212 senses the AM image 21 as an AM optical signal 211 that is modulated with a radio-frequency (RF) signal that can be characterized by a center frequency or carrier frequency $f_c$ and bandwidth $f_b$. The photodetector 212 converts this AM optical signal 211 into an AM analog signal 213 at the carrier frequency $f_c$ and bandwidth $f_b$. The Nyquist frequency $f_N$ of the this AM analog signal 213 is $2(f_c+f_b/2)$. If the carrier frequency $f_c$ is high enough, the Nyquist frequency $f_N$ may be higher than the DFPA's frame rate, making it challenging to sample the AM analog signal 213 directly with the DFPA.

To address this challenge, the pixel 210 digitizes and down-converts the AM analog signal 213 as follows. First, the current-to-frequency converter 214 samples the AM analog signal 213 to form an electronic pulse train 215. This pulse train 215 is an asynchronous pulse train with instantaneous frequency proportional to the instantaneous input current (AM analog signal 213) from the photodetector 212. While the camera's shutter is open, the number of pulses within the shutter time gives the digital output which, when multiplied by the electrons per count, yields the total integrated signal electrons. The shutter should be operated fast enough (i.e., shutter integration time short enough) to ensure that the AM modulation is sampled at the Nyquist frequency of the modulation.

FIG. 2B shows the spectrum and Nyquist frequency of the AM analog signal 213. The signal has a center frequency $f_c$ and bandwidth $f_b$. The corresponding maximum and minimum Nyquist frame rates $f_{FR}$ are $2(f_c+f_b/2)$ and $2f_b$, respectively, for double-sideband signal modulation and $f_c+f_b/2$ and $f_b$, respectively, for single-sideband signal modulation. For high center frequencies (e.g., 100 kHz or more), these frame rates can be prohibitively fast for a DFPA 110 with many pixels 210.

Figure 2C:
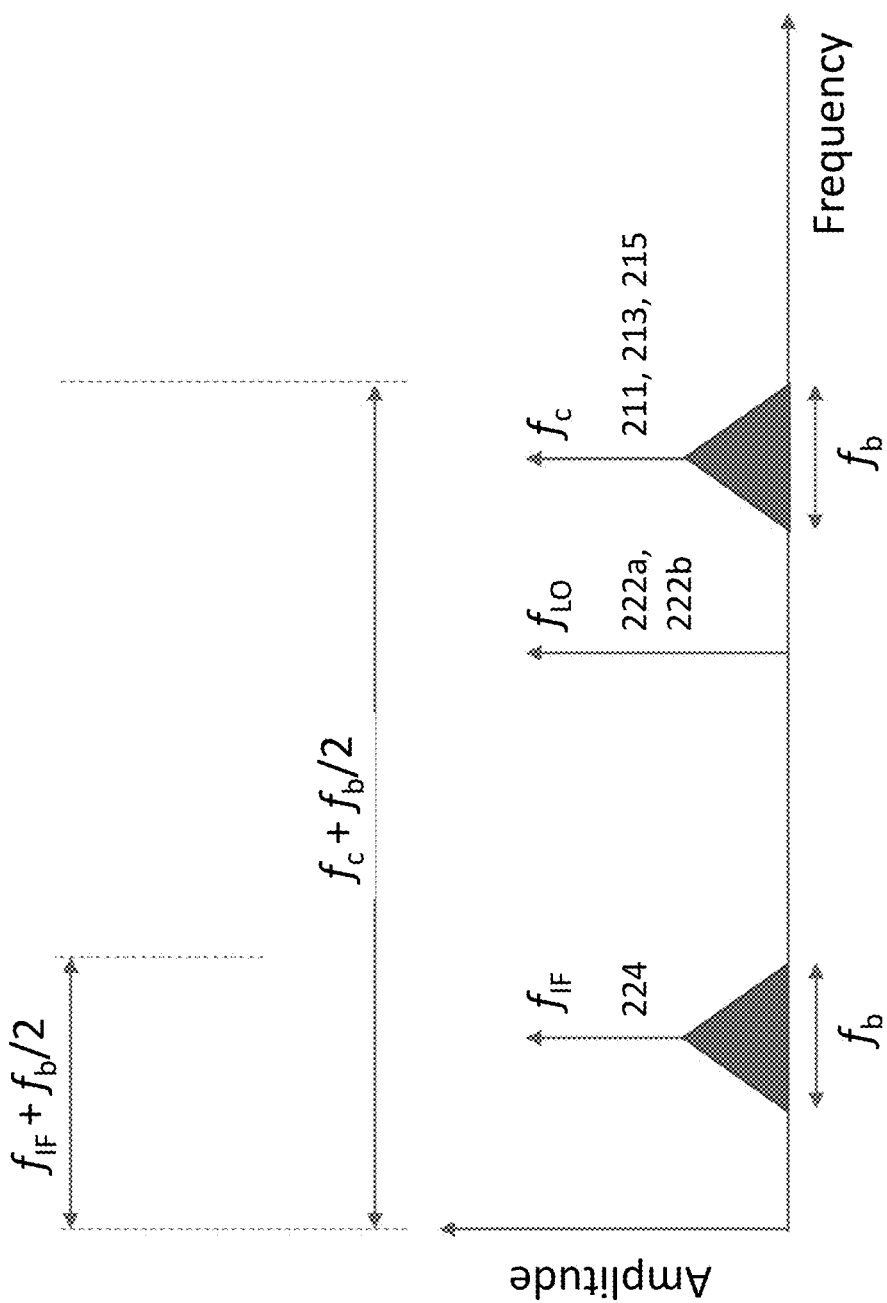
FIG. 2C illustrates the mixing operation performed by the pixel of FIG. 2A.

The Nyquist frame rate can be reduce by mixing the AM analog signal 213 down to a lower frequency using the counters 216. The first up/down counter 216a counts the pulses in a first copy of the pulse train 214 while being toggled or switched between up- and down-counting modes by a mixing signal 231a from a first LO 230a. If the mixing signal 231a is a square wave at a mixing frequency $f_{LO}$, the first counter 216a will end up storing an in-phase, digital representation of the AM optical signal mixed down to a carrier frequency of $f_c-f_{LO}=f_{IF}$ with a bandwidth $f_b$ as shown in FIG. 2C. Similarly, the second up/down counter 216b counts the pulses in a second copy of the pulse train 214 while being toggled or switched between up- and down-counting modes by a 90° phase-shifted mixing signal 231b to produce a quadrature, digital representation of the AM optical signal mixed down to a carrier frequency of $f_c-f_{LO}=f_{IF}$ with a bandwidth $f_b$. The square waves (mixing signals 231a and 231b) applied to the in-phase counter 216a and quadrature counter 216b can be generated using up-down DFPA commands; to implement a square wave with frequency $f_{LO}$, each counter 216 is configured to decrement the digital number that it stores (count down) for a period of $1/(2f_{LO})$, then to increment the digital number (count up) for a time increment equal to $1/(2f_{LO})$.

This mixing operation reduces the Nyquist sampling rate of the in-phase and quadrature representations to $f_N=2(f_c-f_{LO}+f_b/2)=2(f_{IF}+f_b/2)$ for double-sideband signal modulation and $(f_c-f_{LO}+f_b/2)=(f_{IF}+f_b/2)$ for single-sideband signal modulation (e.g., signal modulation represented by in-phase I(t) and quadrature Q(t) waveforms). If the center frequency $f_c$ and bandwidth $f_b$ are known a priori, the mixing frequency $f_{LO}$ can range between a minimum of 0 to a maximum of $f_c-f_b/2$, corresponding to maximum and minimum Nyquist frame rate $f_{FR}$ values of $2(f_c+f_b/2)$ and $2f_b$, respectively, for double-sideband signal modulation. For single-sideband modulation, the maximum and minimum Nyquist frame rates are $f_c+f_b/2$ and $f_b$, respectively. Here the DFPA frame rate is the rate at which the counters 216 are read out. The following descriptions assume simple double-sideband signal modulation; single-sideband modulation would enable twice the signal bandwidth for the same frame rate.

The counters 216a and 216b accumulate in-phase and quadrature counts, respectively, during an integration period of less than or equal to $1/f_N=1/[2(f_c-f_{LO}+f_b/2)]$. For signals mixed to baseband (i.e., for $f_c=f_{LO}$), the integration period is less than or equal to $1/(2f_b)$. At the end of each integration period, the control and I/O circuitry 120 simultaneously reads all of the counters 216 in all of pixels 210 to produce time samples 224. The frequency of this read-out operation is the frame rate $f_{FR}$, which can be at video rates or higher and is greater than or equal to $2f_b$.

Spectral processing can be used on the video image produced by the DFPA to detect the presence of an AM optical signal 211 at the carrier frequency $f_c$. Once the AM optical signal 211 is detected, standard AM demodulation techniques can be applied to the time series 224 obtained from each signal-bearing pixel 210.

The counters 216 in the different pixels 210 the DFPA 110 can all be modulated at the same frequency $f_{LO}$, e.g., for scanning as described below, or at different frequencies. For instance, the counters 216 in different pixels 210 or groups of pixels 210 in the DFPA 110 can be modulated at (different) frequencies selected to match or approximate the center frequencies of different AM optical signals 211 in different sections of the DFPA's field of view. This enables the DFPA 110 to receive and demodulate different AM optical signals 211 simultaneously at frame (readout) rates that are lower than the Nyquist sampling rate of the highest-frequency AM optical signal 211.

A low-intensity beacon waveform (e.g., the AM optical signal) detected initially by the DFPA 110 can encode channel-specific attributes (e.g., channel-specific carrier and bandwidth). One way to encode the beacon waveform is by frequency bin location. For example, a readout rate of 1 kHz and an integration (or search) time of 1 second gives 1,000 possible frequency bin locations or about $2^{10}$ bits of available channel capacity. The counters 216 in the pixels 210 used to detect these beacons could be modulated and read out independently to accommodate different channel characteristics. For example, the DFPA 110 could be periodically switched into the AM detection mode described above to see if there are any beacons ready to communicate. If so, then the DFPA 110 can identify the beacon's center frequency $f_c$ and bandwidth $f_b$ and configure the local oscillator frequency $f_{LO}$ and frame rate to receive the AM modulated signal.

Figure 2D:
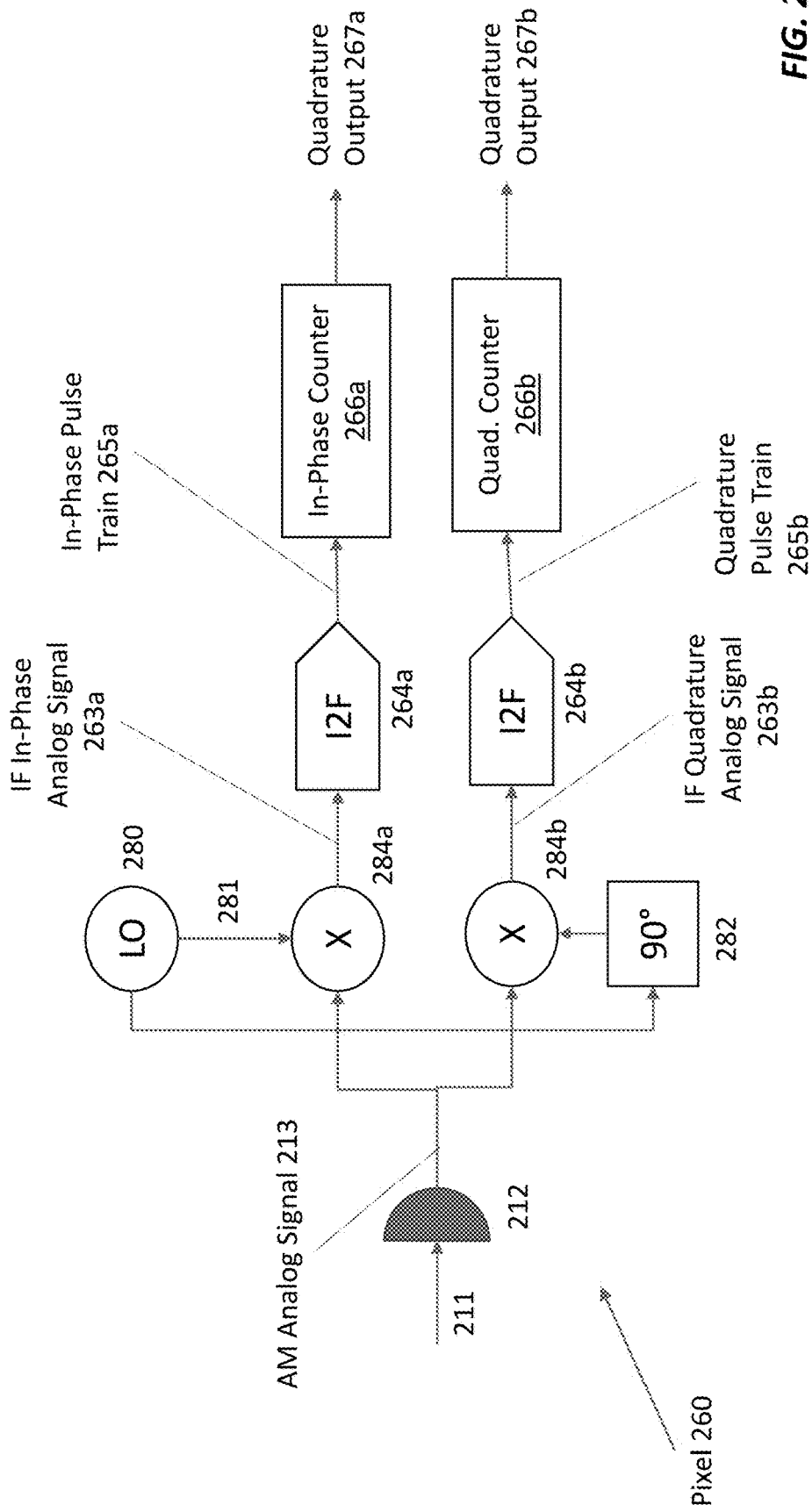
FIG. 2D shows an alternative pixel suitable for use in a focal plane array that performs wide-area sensing of AM signals.

FIG. 2D shows an alternative pixel 260 for wide-area sensing of AM signals. In this pixel 260, the digital architecture in the DFPA 110 is replaced at least in part by a pair of analog mixers 284a and 284b for each photodetector 212 (pixel 260). The first analog mixer 284a mixes a first copy of the analog output 213 from the corresponding photodetector 212 with an analog in-phase mixing signal 231a at a carrier frequency $f_c$ from an LO 280. Similarly, the second analog mixer 284b mixes another copy of the analog output 213 with an analog quadrature mixing signal 231b, which is the analog in-phase mixing signal shifted by 90° by a 90° phase shifter 282 (alternatively, the analog quadrature mixing signal 231b can be generated by a separate local oscillator as shown in FIG. 2A).

The mixers 284a and 284b produce intermediate frequency (IF) in-phase and quadrature analog signals 263a and 263b, which are converted by respective current-to-frequency converters 264a and 264b into an in-phase pulse train 265a and a quadrature pulse train 265b, respectively. Because the current-to-frequency converters 264 operate on the down-converted signals 263, they can operate at lower rates than the current-to-frequency converter 214 in the pixel 210 of FIG. 2A. A first counter 266a counts the pulses in the in-phase pulse train 265a, and a second counter 266b counts the pulses in the quadrature pulse train 265b as described above. The counter outputs are the in-phase output 267a and quadrature output 267b, which can be read out and post-processed as described above.

The pixels 210 and 260 each detect and accumulate in-phase and quadrature components of the AM signal. In-phase and quadrature sampling is advantageous because it yields a signal even if the counter is out of phase with the input signal (e.g., mixing a sine wave with a cosine wave produces a null result). But the pixels do not have to detect in-phase and quadrature components. Instead, they can integrated a digitized, down-converted version of the AM optical signal with a single counter. In the digital pixel 210 in FIG. 2A, this can implemented by simply eliminating the quadrature counter 216b and phase shifter 232. In the hybrid analog/digital pixel 260 in FIG. 2D, this can be implemented by eliminating the phase shifter 282, second mixer 283b, second current-to-frequency converter 264b, and quadrature counter 216b.

The mixing and integrating operations described above can be applied to the entire focal plane array or to one or more sub-regions of the DFPA 110. In the latter case, the effective frame rate (in this case, the rate at which the sub-regions of the DFPA 110 can be read out) can be significantly increased relative to the full DFPA frame rate, thereby enabling detection and demodulation of higher bandwidth AM signals. In this way, information regarding the location of the signal within the DFPA can be used to detect and demodulate higher bandwidth AM signals.

Scanning and Multi-Camera Operation

Figure 3A:
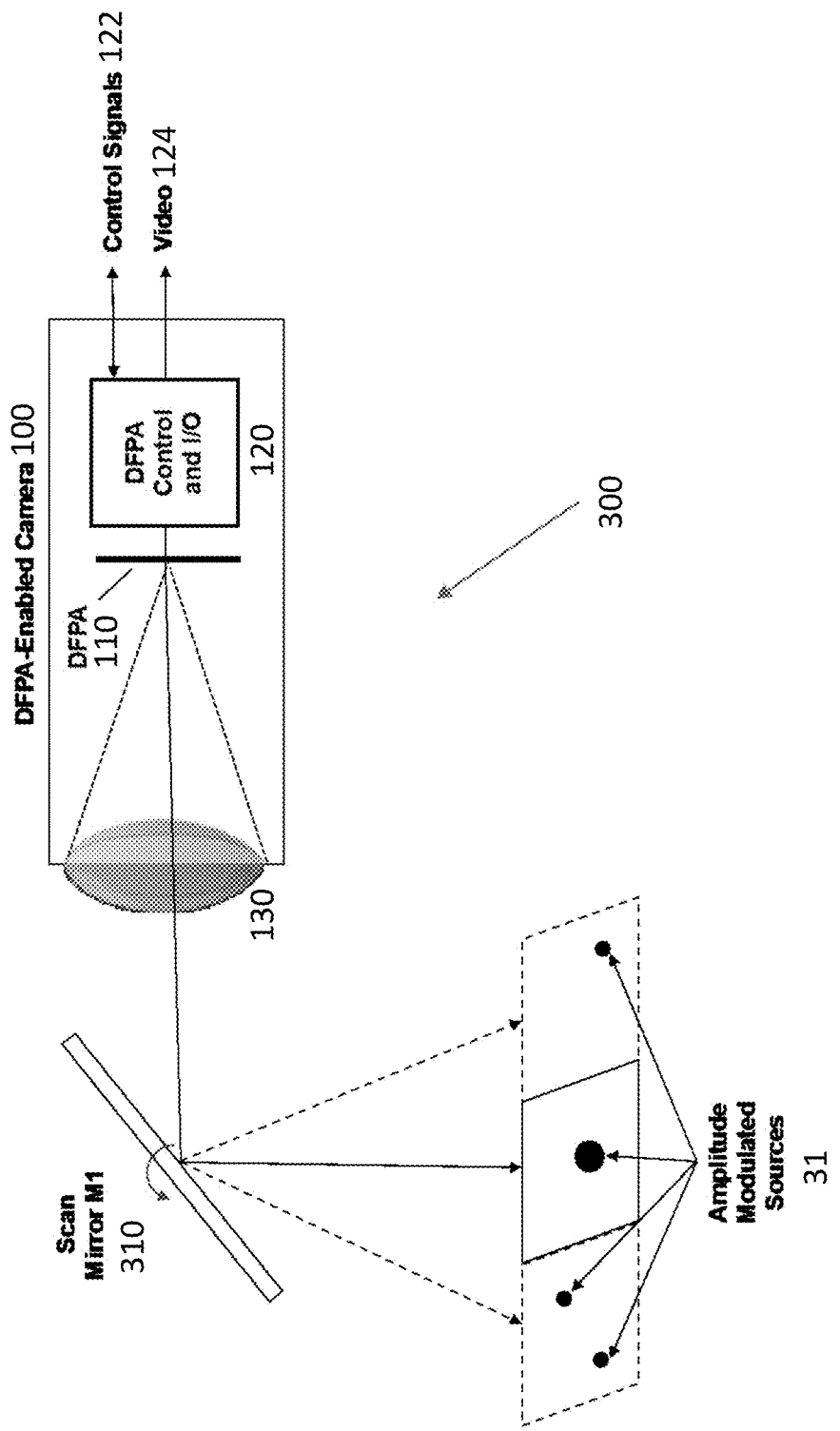
FIG. 3A shows a scanning sensor (three scan positions are shown) that senses AM optical signals.
Figure 3B:
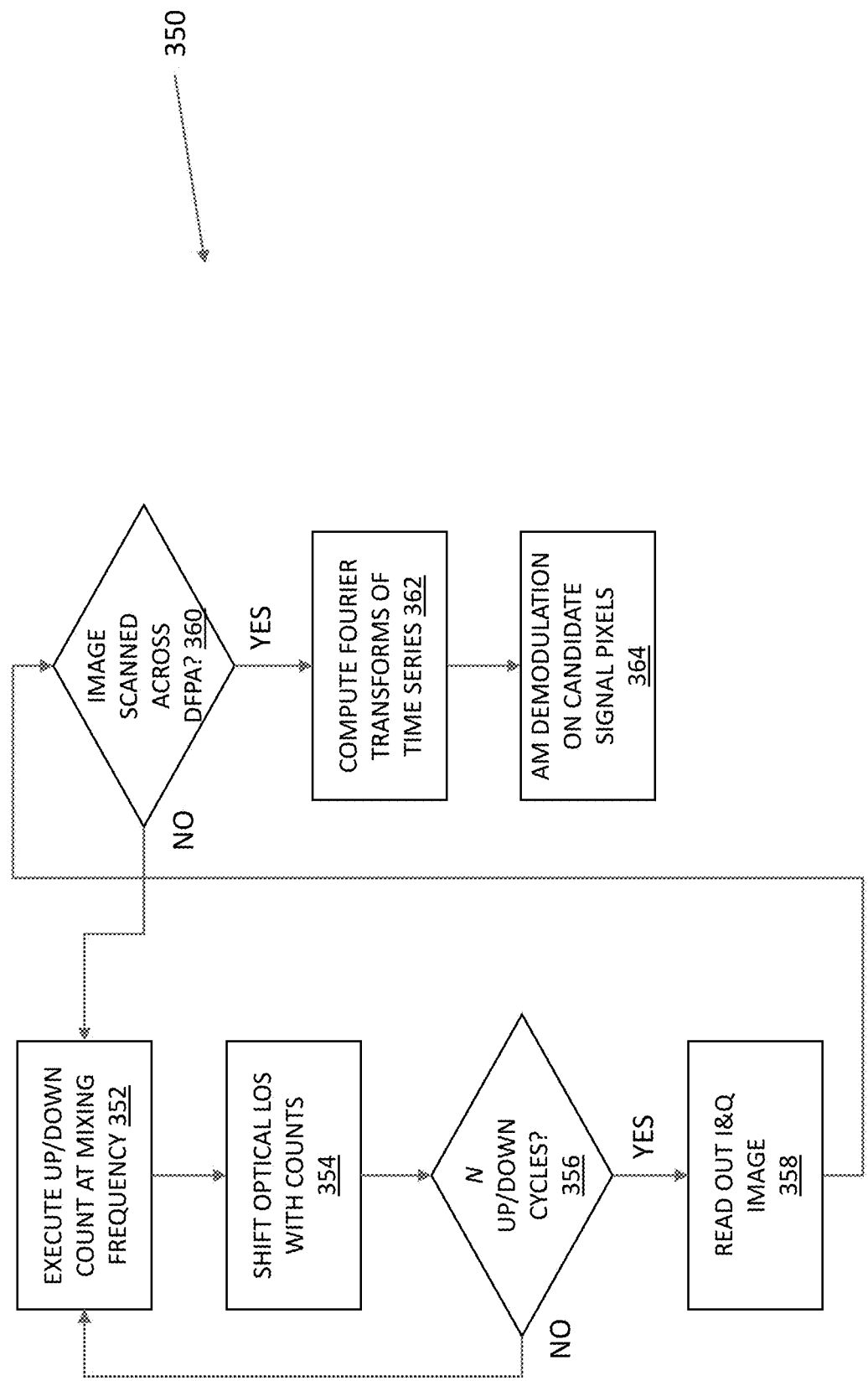
FIG. 3B illustrates a process for sensing AM optical signals with a scanning sensor (e.g., the scanning sensor of FIG. 3A).

FIGS. 3A and 3B illustrate how the AM signal sensing process outlined above can be extended to scanning and/or multi-camera configurations. FIG. 3A shows a scanning system 300 with a DFPA-enabled camera 100 (e.g., as depicted in FIG. 1) that detects light reflected by a scan mirror 310. As the scan mirror 310 rotates, it scans images of AM sources 11 across the DFPA 110 in the camera 100, increasing the DFPA's effective field-of-view. A multi-camera scanning configuration can further increase the total field-of-view.

FIG. 3B illustrates a process 350 for sensing AM signals with a scanning system like the one in FIG. 3A. To start, the DFPA executes one or execute one or more array-wide up-down count sequences (square-wave modulation 231) defined by the mixing frequency of interest $f_{LO}$ to the in-phase and quadrature counters 216 in the DFPA pixels 210 (step 352). After an integer number of count sequences, the DFPA's transfer circuitry shifts the accumulated counts concurrently with camera's optical line-of-sight. Put differently, the DFPA's field-of-view scans synchronously with the DFPA's contents (step 354). (The field-of-view scanning can be produced with a scan mirror 310 as in FIG. 3A or by moving the camera 100 relative to the scene.) These counting and scanning steps repeat until the time to execute an integer number N≥1 of up-down counting cycles corresponds to the Nyquist frequency bandwidth or uncertainty of the signal frequency of the AM signal being detected. In the case of a beacon that encodes information in the location of a single frequency, the Nyquist bandwidth should accommodate all possible beacon frequencies if there is no a priori knowledge of the possible beacon frequencies.

Once steps 352 and 354 have been repeated for a period of less than or equal to an integration period of less than or equal to $1/f_{N'} = 1/[2(f_c - f_{LO} + f_b/2)]$ (step 356), the image is read out of the DFPA (step 358). Put differently, the DFPA is read a frame rate greater than or equal to the Nyquist frequency $f_{N'}$ of the down-converted (in-phase and quadrature) samples stored in the counters. Between frame readouts, the pixels in the DFPA count pulses in a digitized, down-converted beacon signal while synchronously shifting the counts with relative motion of the DFPA and beacon. Ensuring that a complete up-down count is achieved prior to shifting a count from one pixel to the next pixel avoids or reduces signal-to-noise ratio (SNR) loss due to pixel-to-pixel response non-uniformities.

The data read out from the DFPA can be considered a time series. For pixels that sense AM signals, the time series varies with the AM modulation. For pixels that are imaging, the time series is constant, at least on the time scale of the AM modulation. Computing Fourier transforms of the time series makes it possible to distinguish the pixels that detected AM signals from the pixels that simply imaged the scene. The time series from the pixels that detected AM optical signals can then be demodulated to yield the signal of interest (the amplitude modulation).

Figure 4A:
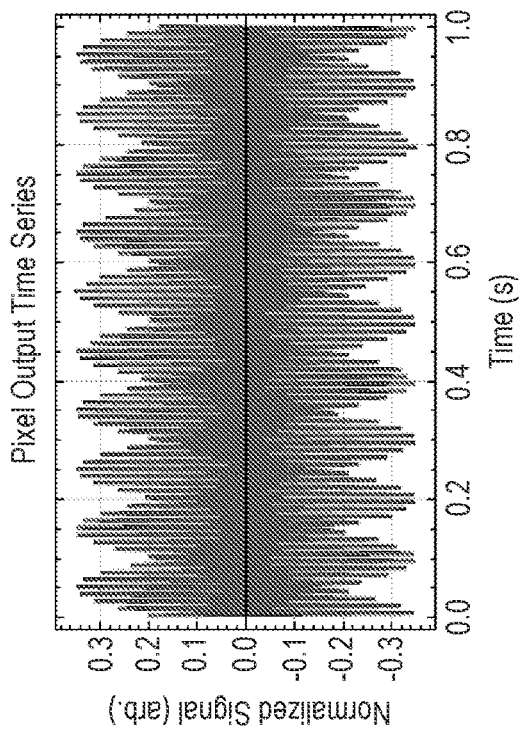
FIG. 4A shows a simulated input signal, in-phase waveform, quadrature waveform, and integration period in the time domain for a single pixel (e.g., the pixel of FIG. 2A).
Figure 4B:
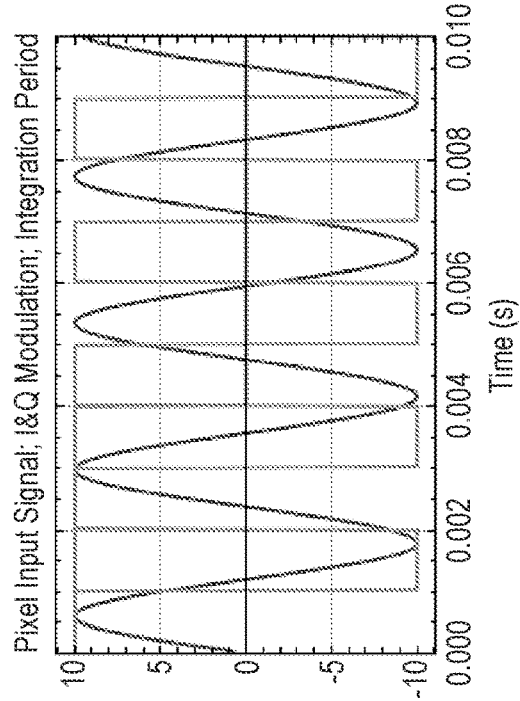
FIG. 4B shows a simulated time-domain output from a single pixel.
Figure 4C:
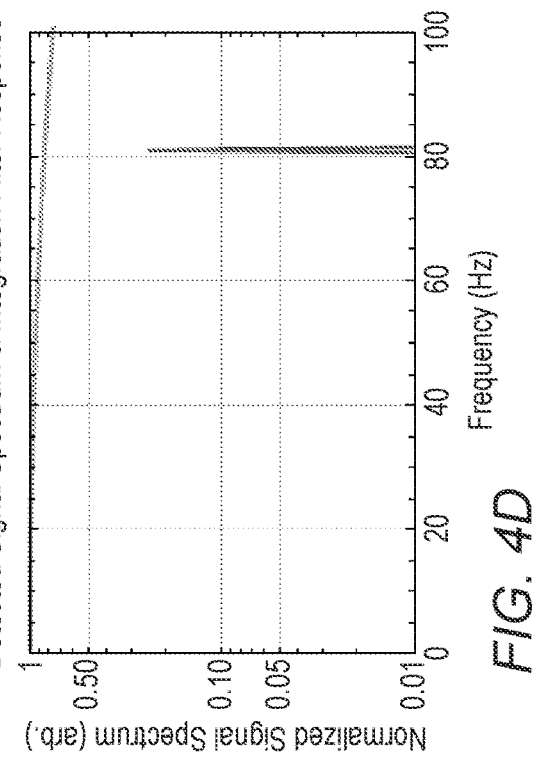
FIG. 4C shows a simulated input signal, in-phase waveform, quadrature waveform, and integration period in the frequency domain for a single pixel.
Figure 4D:
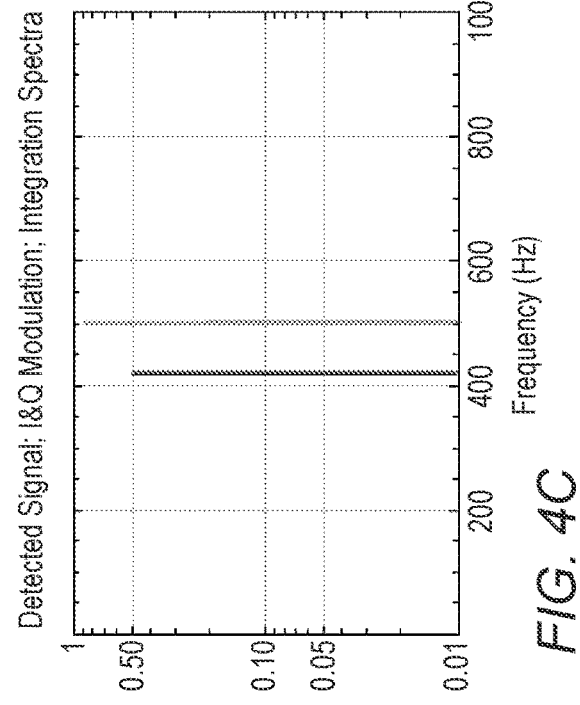
FIG. 4D shows a simulated detected signal spectrum and integration filter response in the frequency domain.

FIGS. 4A-4D are plots of simulated time- and frequency-domain input signals, mixing waveforms, and output signals for a single pixel sensing an AM signal. FIG. 4A shows a simulated input signal, in-phase waveform, and quadrature waveform over one integration period in the time domain for a single pixel (e.g., the pixel of FIG. 2A). There are an integer number of up/down counts in the in-phase and quadrature waveforms during the integration period. FIG. 4B shows a simulated time-domain output from a single pixel. It has sinusoidal envelope riding on a higher-frequency carrier. FIG. 4C shows the same simulated input signal, in-phase waveform, and quadrature waveform in the frequency domain. FIG. 4D shows a simulated detected signal spectrum and integration filter response (top trace) in the frequency domain. The signal spectrum is centered on a frequency of about 80 Hz, which is lower than the 3 dB cutoff of the filter.

CONCLUSION

All parameters, dimensions, materials, and configurations described herein are meant to be exemplary and the actual parameters, dimensions, materials, and/or configurations will depend upon the specific application or applications for which the inventive teachings is/are used. It is to be understood that the foregoing embodiments are presented primarily by way of example and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which at least one example has been provided. The acts performed as part of the method may in some instances be ordered in different ways. Accordingly, in some inventive implementations, respective acts of a given method may be performed in an order different than specifically illustrated, which may include performing some acts simultaneously (even if such acts are shown as sequential acts in illustrative embodiments).

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of detecting an amplitude-modulated (AM) optical signal having a center frequency $f_c$ and a bandwidth $f_b$, the method comprising, at a pixel in an imaging array:

transducing the AM optical signal to an AM analog signal with a photodetector in the pixel;

converting the AM analog signal to an electronic pulse train with a current-to-frequency converter in the pixel;

mixing a first copy of the electronic pulse train with an in-phase square wave modulated at a mixing frequency $f_{LO}$ to produce an in-phase representation of the AM optical signal;

mixing a second copy of the electronic pulse train with a quadrature square wave modulated at the mixing frequency $f_{LO}$ to produce a quadrature representation of the AM optical signal; and integrating the in-phase representation and the quadrature representation in the pixel over at least part of an integration period less than or equal to $\frac{1}{2}f_b$; and reading the in-phase representation and the quadrature representation from the pixel at a frame rate greater than or equal to $2f_b$.

2. The method of claim 1, wherein the center frequency $f_c$ is about 100 kHz to about 10 GHz and the bandwidth $f_b$ is about 10 kHz to about 100 kHz.

3. The method of claim 1, wherein mixing the first copy of the electronic pulse train with the in-phase square wave and integrating the in-phase representation comprise counting pulses in the electronic pulse train with a first counter in the pixel while switching the first counter between a count-up mode and a count-down mode at the mixing frequency $f_{LO}$.

4. The method of claim 1, wherein the pixel is a first pixel in the imaging array, and further comprising, at second pixel in the imaging array:

transducing another AM optical signal having a center frequency $f_{c2}$ and a bandwidth $f_{b2}$ to another AM analog signal with a photodetector in the second pixel;

converting the other AM analog signal to another electronic pulse train with a current-to-frequency converter in the second pixel;

mixing a first copy of the other electronic pulse train with the in-phase square wave modulated to produce an in-phase representation of the other AM optical signal;

mixing a second copy of the other electronic pulse train with the quadrature square wave to produce a quadrature representation of the other AM optical signal; and integrating the in-phase representation of the other AM optical signal and the quadrature representation of the other AM optical signal in the second pixel over at least part of an integration period less than or equal to $\frac{1}{2}f_{b2}$; and reading out the in-phase representation of the other AM optical signal and the quadrature representation of the other AM optical signal from the second pixel at a frame rate greater than or equal to $2f_{b2}$.

5. The method of claim 1, further comprising:

Fourier transforming the in-phase representation and the quadrature representation to produce a spectral signature of the AM optical signal.

6. The method of claim 1, wherein the pixel is a first pixel, and further comprising:

integrating the in-phase representation in the first pixel during a first portion of the integration period;

transferring the in-phase representation from the first pixel to a second pixel in the imaging array; and integrating the in-phase representation in the second pixel during a second portion of the integration period.

7. The method of claim 6, wherein the first portion of the integration period is an integer multiple of the reciprocal of the mixing frequency $f_{LO}$.

8. The method of claim 6, wherein transferring the in-phase representation from the first pixel to the second pixel occurs synchronously with motion of the imaging array with respect to a source of the AM optical signal.

9. The method of claim 6, further comprising:

demodulating the in-phase representation.

10. An imaging array for detecting an amplitude-modulated (AM) optical signal having a center frequency $f_c$ and a bandwidth $f_b$, the imaging array comprising:

a pixel comprising:

a photodetector to transduce the AM optical signal to an AM analog signal with a photodetector in the pixel;

a current-to-frequency converter, operably coupled to the photodetector, to convert the AM analog signal to an electronic pulse train;

a first counter, operably coupled to the current-to-frequency converter, to count pulses in a first copy of the electronic pulse train over at least part of an integration period less than or equal to $\frac{1}{2}f_b$;

a second counter, operably coupled to the current-to-frequency converter, to count pulses in a second copy of the electronic pulse train over the at least part of the integration period; and circuitry, operably coupled to the first counter and to the second counter, to (i) mix the first copy of the electronic pulse train with an in-phase square wave modulated at a mixing frequency $f_{LO}$ to produce an in-phase representation of the AM optical signal in the first counter, (ii) mix a second copy of the electronic pulse train with a quadrature square wave modulated at the mixing frequency $f_{LO}$ to produce a quadrature representation of the AM optical signal, and (iii) read out the in-phase representation from the first counter and the quadrature representation from the second counter at a frame rate greater than or equal to $2f_b$.

11. The imaging array of claim 10, wherein the center frequency $f_c$ is about 100 kHz to about 10 GHz and the bandwidth $f_b$ is about 20 kHz to about 100 kHz.

12. The imaging array of claim 10, wherein the circuitry is configured to mix the first copy of the electronic pulse train with the in-phase square wave by switching the first counter between a count-up mode and a count-down mode at the mixing frequency $f_{LO}$.

13. The imaging array of claim 10, wherein the pixel is a first pixel, the photodetector is a first photodetector, the current-to-frequency converter is a first current-to-frequency converter, and the circuitry is first circuitry, and further comprising:

a second pixel comprising:

a second photodetector to transduce another AM optical signal to another AM analog signal;

a second current-to-frequency converter, operably coupled to the second photodetector, to convert the other AM analog signal to another electronic pulse train;

a third counter, operably coupled to the second current-to-frequency converter, to count pulses in a first copy of the other electronic pulse train over at least part of an integration period less than or equal to $\frac{1}{2}f_{b2}$;

a fourth counter, operably coupled to the second current-to-frequency converter, to count pulses in a second copy of the other electronic pulse train over the at least part of the integration period less than or equal to $\frac{1}{2}f_{b2}$; and second circuitry, operably coupled to the third counter and to the fourth counter, to (i) mix the first copy of the other electronic pulse train with the in-phase square wave to produce an in-phase representation of the other AM optical signal in the third counter, (ii) mix a second copy of the other electronic pulse train with the quadrature square wave to produce a quadrature representation of the other AM optical signal, and (iii) read out the in-phase representation from the third counter and the quadrature representation from the fourth counter at a frame rate greater than or equal to $2f_{b2}$.

14. The imaging array of claim 10, wherein the pixel is a first pixel, and further comprising:

a second pixel; and transfer circuitry, operably coupled to the first pixel and the second pixel, to transfer the in-phase representation from the first pixel to the second pixel.

15. The imaging array of claim 14, wherein the first pixel configured to integrate the in-phase representation during a first portion of the integration period and the second pixel is configured to integrate the in-phase representation during a second portion of the integration period.

16. The imaging array of claim 15, wherein the first portion of the integration period is an integer multiple of the reciprocal of the mixing frequency $f_{LO}$.

17. The imaging array of claim 15, wherein the transfer circuitry is configured to transfer the in-phase representation from the first pixel to the second pixel synchronously with motion of the imaging array with respect to a source of the AM optical signal.

* * * * *